US007545560B2

(12) United States Patent
Kwon

(10) Patent No.: US 7,545,560 B2
(45) Date of Patent: Jun. 9, 2009

(54) ALAS/GAAS ALLOY TO ENHANCE N-TYPE DOPING IN ALGAAS DISTRIBUTED BRAGG REFLECTOR

(75) Inventor: Hoki Kwon, Plymouth, MN (US)

(73) Assignee: Finisar Corporation, Sunnyvale, CA (US)

( * ) Notice: Subject to any disclaimer, the term of this patent is extended or adjusted under 35 U.S.C. 154(b) by 358 days.

(21) Appl. No.: 10/961,624

(22) Filed: Oct. 8, 2004

(65) Prior Publication Data

US 2006/0078026 A1    Apr. 13, 2006

(51) Int. Cl.
*H01L 31/0304*     (2006.01)
*H01L 31/0352*     (2006.01)

(52) U.S. Cl. ............... 359/344; 257/98; 257/E33.069; 257/E33.072; 257/E51.021

(58) Field of Classification Search ............ 359/344; 257/98, E33.069, E33.072, E51.021; 372/45.012, 372/50.11
See application file for complete search history.

(56) References Cited

U.S. PATENT DOCUMENTS

| 5,038,185 | A | * | 8/1991 | Thornton | 372/46.011 |
|---|---|---|---|---|---|
| 5,158,908 | A | * | 10/1992 | Blonder et al. | 438/32 |
| 5,212,703 | A | * | 5/1993 | Kahen | 372/50.11 |
| 5,229,627 | A | * | 7/1993 | Kosaka | 257/85 |
| 5,568,499 | A | * | 10/1996 | Lear | 372/45.01 |
| 5,699,375 | A | * | 12/1997 | Paoli | 372/50.11 |
| 6,252,221 | B1 | * | 6/2001 | Kaneko et al. | 250/214 LS |
| 6,366,597 | B1 | * | 4/2002 | Yuen et al. | 372/96 |
| 6,631,154 | B2 | * | 10/2003 | Coldren et al. | 372/96 |
| 6,720,585 | B1 | * | 4/2004 | Wasserbauer et al. | 257/98 |
| 6,724,796 | B2 | * | 4/2004 | Hwang et al. | 372/50.1 |
| 6,785,320 | B1 | * | 8/2004 | Amos et al. | 372/102 |
| 6,822,995 | B2 | * | 11/2004 | Kwon | 372/96 |
| RE38,682 | E | * | 1/2005 | Taylor | 372/50.11 |
| 6,888,873 | B2 | * | 5/2005 | Kwon | 372/96 |
| 6,901,096 | B2 | * | 5/2005 | Kwon | 372/43.01 |
| 6,996,150 | B1 | * | 2/2006 | Shakuda | 372/46.01 |
| 7,065,124 | B2 | * | 6/2006 | Biard et al. | 372/99 |
| 7,295,586 | B2 | * | 11/2007 | Kwon | 372/45.01 |
| 2002/0067748 | A1 | * | 6/2002 | Coldren et al. | 372/43 |
| 2003/0123829 | A1 | * | 7/2003 | Taylor | 385/131 |
| 2005/0031001 | A1 | * | 2/2005 | Sugahara et al. | 372/49 |
| 2005/0089074 | A1 | * | 4/2005 | Koelle et al. | 372/50 |

OTHER PUBLICATIONS

Sirtori et al. Influence of DX Centers on the Performance of Unipolar Semiconductor Lasers Based on GaAs-AlGaAs. IEEE Photonics Technology Letters, vol. 11, No. 9, Sep. 1999.*

* cited by examiner

*Primary Examiner*—Eric Bolda
(74) *Attorney, Agent, or Firm*—Workman Nydegger

(57) ABSTRACT

Distributed Bragg reflector (DBR) with reduced DX centers. A DBR includes an AlAs region. The AlAs region includes essentially homogeneous AlAs. The DBR further includes a AlGaAs region. The AlGaAs region includes alternating thin layers of AlAs and GaAs. The alternating thin layers of AlAs and GaAs are arranged such the the AlGaAs region appears as a layer of AlGaAs with appropriate concentrations of Al and Ga.

22 Claims, 1 Drawing Sheet

ALAS/GAAS ALLOY TO ENHANCE N-TYPE DOPING IN ALGAAS DISTRIBUTED BRAGG REFLECTOR

BACKGROUND OF THE INVENTION

1. The Field of the Invention

The invention generally relates to Distributed Bragg Reflectors (DBRs). More specifically, the invention relates to methods of reducing DX centers in DBRs to allow for higher n-type doping.

2. Description of the Related Art

Lasers have become useful in a number of applications. For example, lasers may be used in optical communications. Laser light pulses may be used to transmit digital data across a fiber-optic network. A laser may be modulated by an electronic digital signal to produce an optical digital signal that is transmitted on a fiber-optic cable. At a receiver end, a photodiode or other optically sensitive device converts the optical signal to an electronic digital signal. Optical networks allow modern computing devices to communicate at high speeds and over long distances.

One particular type of laser that is used in optical communications is the Vertical Cavity Surface Emitting Laser (VCSEL). As its name suggests, a VCSEL emits light from a surface, typically the top surface, of the laser. The VCSEL has a cavity bounded by a top mirror and a bottom mirror that reflect photons in the cavity. The top and bottom mirrors are generally distributed Bragg reflector (DBR) mirrors. DBR mirrors are formed by alternating a number of layers of materials with higher and lower indices of refraction.

In one example, a VCSEL designed to emit light with a wavelength of 650 to 670 nm is formed on a Gallium Arsenide (GaAs) substrate. The VCSEL may have mirrors that are formed from alternating layers of AlAs and Al0.5Ga0.5As (i.e. 50% Al to 50% Ga ratio). Between the top and bottom mirror is the active region which includes a pn junction to form a diode.

The DBR mirrors may be doped with n and p-type impurities which allows for current to be conducted through the mirrors to provide a bias current for the pn junction in the active region. To reduce the series resistance of the n-type mirror for example, the DBR mirror is heavily doped such that the free carrier concentration is $n = 1 \times 10^{18}$ cm$^{-3}$.

One phenomenon that exists in n-type mirrors that have an Al concentration of about 40%-60% is known as a DX center. A DX center occurs when an atom in a crystal structure exists where it ordinarily should not exist. This results in a band that exists between the valance band and the conduction band. This intermediate band can absorb free carriers, such as holes and electrons. The free carriers tend to become trapped in the DX center such that they are not available for conducting current or generating light. DX centers cause higher series resistance in VCSELs, higher leakage currents, and a reduction in doping effectiveness. This results in a need to increase bias currents, that supply current to the VCSEL, to obtain a particular optical output level. Ultimately, DX centers reduce the amount of power and power swing available for VCSEL laser applications. This can result in a reduction in the distance that data can be transmitted and an increase in the number of bit errors existing in a digital optical network.

BRIEF SUMMARY OF THE INVENTION

One embodiment of the invention includes a distributed Bragg reflector (DBR). The DBR includes an AlAs region. The AlAs is an essentially homogeneous layer of AlAs. The DBR further includes an AlGaAs region. The AlGaAs region includes a number of thin AlAs layers and a number of thin GaAs layers alternating with the thin AlAs layers. The AlAs layers and GaAs layers are arranged such that The AlGaAs region appears in the far field as a layer of AlGaAs with appropriate concentrations of Al and Ga.

Another embodiment includes a method of making DBRs. The method includes forming an AlAs region that includes an essentially homogenous layer of AlAs. The method further includes forming an AlGaAs region. Forming an AlGaAs region includes forming alternating thin layers of AlAs and GaAs. The alternating layers of AlAs and GaAs are formed such that in the far field, the alternating layers appear as a layer of AlGaAs with appropriate concentrations of Al and Ga.

Advantageously, some embodiments of the invention allow for doping of a DBR with high concentrations of n-type dopants while reducing the effect of DX centers in the DBR. This allows for the creation of highly conductive DBRs while reducing free-carrier absorption in the DBRs. These highly conductive DBRs can be used to help reduce bias current that are needed for VCSELs incorporating the DBR mirrors and reduces free carrier absorption in the VCSELs which ultimately results in a greater available power swing and reduced bit error rates in signals transmitted using the VCSEL.

These and other advantages and features of the present invention will become more fully apparent from the following description and appended claims, or may be learned by the practice of the invention as set forth hereinafter.

BRIEF DESCRIPTION OF THE SEVERAL VIEWS OF THE DRAWINGS

In order that the manner in which the above-recited and other advantages and features of the invention are obtained, a more particular description of the invention briefly described above will be rendered by reference to specific embodiments thereof which are illustrated in the appended drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION OF THE INVENTION

Figure 1:
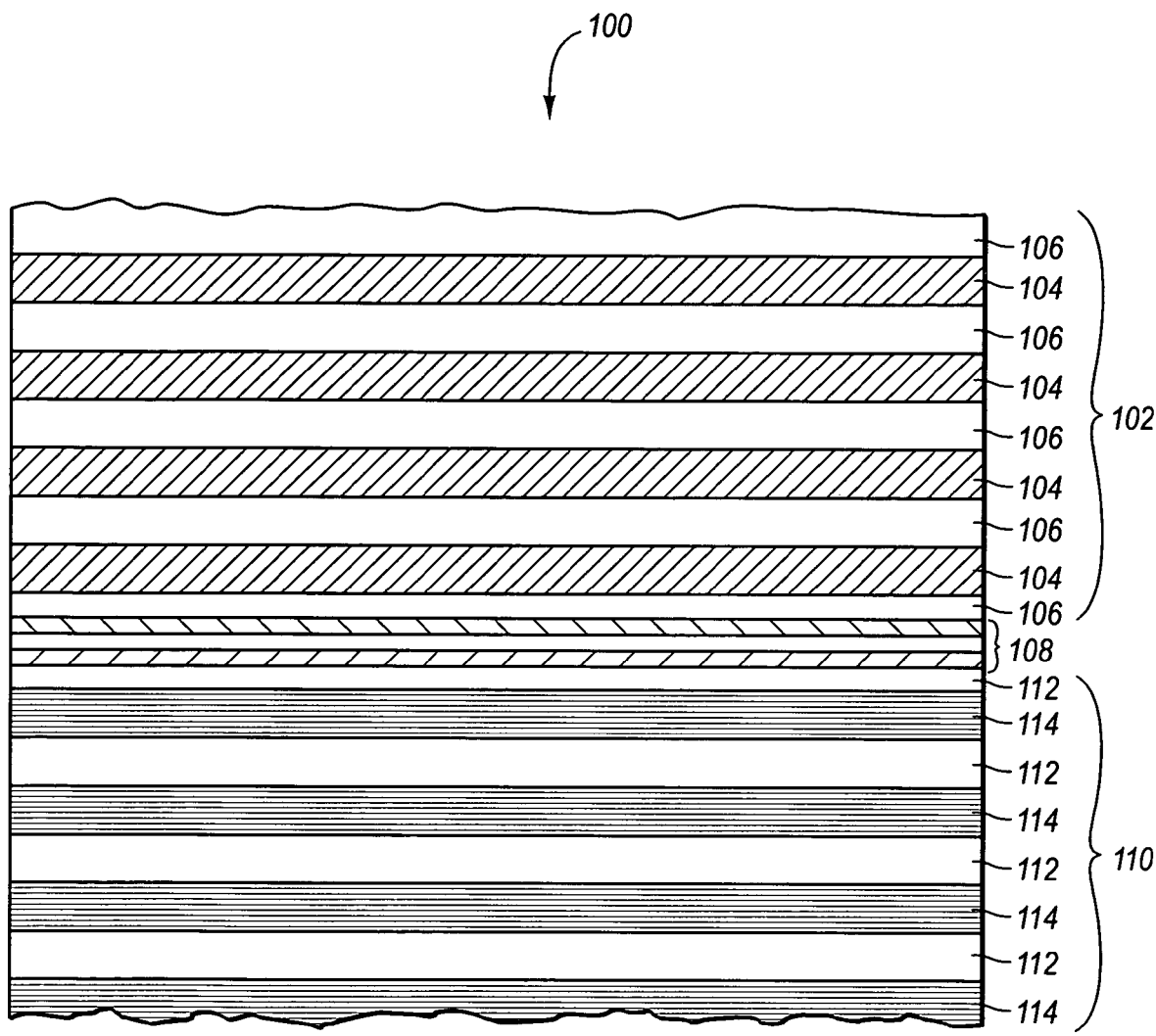
FIG. 1 illustrates and epitaxial structure that incorporates various aspects of the present invention.

One embodiment is implemented by constructing an epitaxial layer that includes an n-type DBR mirror where alternating layers of AlAs and GaAs are substituted for one or more of the AlGaAs layers that are ordinarily found in DBR mirrors. The alternating layers of AlAs and GaAs are sufficiently thin so as to appear in the far-field as an AlGaAs layer with the appropriate percentages of Al and Ga.

Referring now to FIG. 1, an example of a VCSEL epitaxial structure 100 that incorporates aspects of the present invention is shown. The epitaxial structure 100 includes a top DBR mirror 102 which is a p-type mirror. The top DBR mirror 102 includes alternating regions 104, 106 of lower and higher index of refraction materials. Below the top DBR mirror 102 is an active region 108 where photons are generated. Below the active region 108 is a bottom DBR mirror 110.

The bottom DBR mirror 110 includes alternating regions of higher and lower index of refraction materials. One region is an AlAs region 112 with an essentially homogeneous layer of AlAs. A second region is an AlGaAs region 114. The AlGaAs region 114, in the example shown, includes alternating layers of essentially homogeneous AlAs and GaAs. This helps to reduce or eliminate the effects of the DX center phenomenon that is exhibited when a composite AlGaAs material with about 50% Al and 50% Ga is used.

The AlGaAs region 114 should include layers that are sufficiently thin such that in the far-field the essentially homogeneous layers appear to be a composite layer of material with appropriate concentrations of Al and Ga. On the other hand, the layers must be sufficiently thick to reduce the number of interfaces between the layers of AlAs and GaAs which may result in additional DX centers if too many interfaces exist. The layers, in this embodiment, are therefore in a range between about 10 and 100 Angstroms.

The percentage of Al to Ga can be controlled in the AlGaAs region 114 by controlling the thicknesses of the AlAs and GaAs layers to form appropriate concentrations Al and Ga. For example, if a 50/50 Al to Ga composition is desired, the AlAs and GaAs layers may be of essentially the same thickness. If more Al is desired than Ga, one or more of the AlAs layers may be thicker than the GaAs layers. If more gallium it is desired than aluminum, one or more of the GaAs layers may be thicker than the AlAs layers.

The effects of DX centers are not as prevalent when the amount of Al is below 20% or when the amount of Ga is below 20% in a composite material comprising AlGaAs. Thus, in exemplary embodiments, the AlAs layer may be a composite layer with a Ga content of less than 20%. Further, the GaAs layer may be a composite layer with an Al content of less than 20%.

The thin layers of AlAs and GaAs are formed with abrupt atomic boundaries. This may be done by forming the layers using metal organic chemical vapor deposition (MOCVD) or molecular beam epitaxy (MBE). During these processes, the n-type DBR mirror 110 may be doped with n-type dopants such as Si, Te, Sn, Se and S. Because of the use of the alternating thin layers of AlAs and GaAs, the n-type dopants may be at of level of $n=1\times10^{18}$ cm$^{-3}$ or higher.

The n-type DBR mirrors described above may be useful in Vertical Cavity Surface Emitting Laser (VCSEL) applications. In one ebodiment, the n-type DBR mirrors may be used in VCSELs designed to emit light in the range of 650-670 nm.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

What is claimed is:

1. A distributed Bragg reflector (DBR) comprising:
   a plurality of AlAs regions that comprise a layer of AlAs; wherein the plurality of AlAs regions includes a first AlAs region and a second AlAs region;
   a plurality AlGaAs regions alternating with the AlAs region, wherein at least one AlGaAs region is a composite comprising:
      a plurality of thin AlAs layers and a plurality of thin GaAs layers, wherein the thin AlAs layers and the thin GaAs layers are each essentially homogenous; and
      the plurality of thin GaAs layers alternating with the plurality of thin AlAs layers, wherein each of the plurality of thin AlAs layers and each of the plurality of thin GaAs layers are between 10 and 100 Angstroms thick, such that the alternating thin layers of AlAs and the alternating thin layers of GaAs together form an AlGaAs region;
   wherein the composite AlGaAs region adjoins the first AlAs region beneath the first AlAs region and adjorns the second AlAs region above the second AlAs region.

2. The DBR of claim 1 wherein the AlGaAs region has an Al concentration between 40% and 60%. are between 10 and 100 Angstroms thick.

3. The DBR of claim 1, wherein the AlGaAs region has an Al concentration less than 20%.

4. The DBR of claim 1, wherein the AlGaAs region has a Ga concentration of less than 40%.

5. The DBR of claim 1, wherein the AlGaAs region has a Ga concentration less than 20%.

6. The DBR of claim 1, wherein at least a portion of the AlGaAs region is doped with n-type dopant.

7. The DBR of claim 6, wherein the dopant comprises at least one of Si, Te, Sn, Se and S.

8. The DBR of claim 6, wherein the dopant has a concentration of at least $n=1\times10^{18}$ cm$^{-3}$.

9. The DBR of claim 1, wherein the DBR is configured to be used with a 650-670 nm VCSEL.

10. A method of making a distributed Bragg reflector (DBR) comprising:
    forming an AlAs region that comprises a layer of AlAs, wherein the plurality of AlAs regions includes a first AlAs region and a second AlAs region;
    forming a plurality of composite AlGaAs region that alternates with the plurality of AlAs regions, wherein forming a composite AlGaAs region comprises:
       forming a plurality of thin AlAs layers and a plurality of thin GaAs layers, wherein the thin AlAs layers and the thin GaAs layers are each essentially homogenous; and
       alternating the plurality of thin GaAs layers the plurality of thin AlAs layers, wherein each of the plurality of thin alAs layers and each of the plurality of thin GaAs layers between 10 and 100 angstrom thick, such that the alternating thin layers of AlAs and the alternating thin layers of GaAs together form an AlGaAs region;
    wherein the composite AlGaAs region adjorns the first AlAs region beneath the first AlAs region and adjorns the second AlAs region above the second AlAs region.

11. The method of claim 10, wherein the composite AlGaAs region has an Al concentration of less than 60%.

12. The method of claim 10, wherein the composite AlGaAs region has a Al concentration less than 20%.

13. The method of claim 10, wherein the composite AlGaAs region has a Ga concentration of less than 60%.

14. The method of claim 10, wherein the composite AlGaAs region has a Ga concentration less than 20%.

15. The method of claim 10, further comprising doping at least a portion of the AlGaAs region with n-type dopant.

16. The method of claim 15, wherein doping at least a portion of the AlGaAs region comprises doping the AlGaAs region with at least one of Si, Te, Sn, Se and S.

17. The method of claim 15, wherein the dopant has a concentration of at least $n=1\times10^{18}$ cm$^{-3}$.

18. The DBR of claim 10, wherein the DBR is configured to be used with a 650-670 nm VCSEL.

19. The method of claim 10, wherein the method is performed using metal organic chemical vapor deposition.

20. The method of claim 10, wherein the method is performed using molecular beam epitaxy.

21. The method of claim 1, wherein the AlGaAs region has an Al concentration less than 40%.

22. The method of claim 10, wherein the composite AlGaAs region has a GA concentration less than 40%.

* * * * *

UNITED STATES PATENT AND TRADEMARK OFFICE
CERTIFICATE OF CORRECTION

| | | |
|---|---|---|
| PATENT NO. | : 7,545,560 B2 | Page 1 of 1 |
| APPLICATION NO. | : 10/961624 | |
| DATED | : June 9, 2009 | |
| INVENTOR(S) | : Kwon | |

It is certified that error appears in the above-identified patent and that said Letters Patent is hereby corrected as shown below:

Column 4
Line 32, change "alAs" to --AlAs--

Signed and Sealed this

Fourteenth Day of September, 2010

David J. Kappos
*Director of the United States Patent and Trademark Office*